United States Patent
Torii (10) Patent No.: US 7,092,297 B1
(45) Date of Patent: Aug. 15, 2006

(54) METHOD FOR PULSE ERASE IN DUAL BIT MEMORY DEVICES

(75) Inventor: Satoshi Torii, Sunnyvale, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 75 days.

(21) Appl. No.: 10/899,684

(22) Filed: Jul. 26, 2004

(51) Int. Cl.
*G11C 16/04* (2006.01)

(52) U.S. Cl. .......................... 365/185.29; 365/185.26; 365/185.18

(58) Field of Classification Search ................ None
See application file for complete search history.

(56) References Cited

U.S. PATENT DOCUMENTS

| | | | | |
|---|---|---|---|---|
| 5,856,942 A | * | 1/1999 | Lee et al. | 365/185.11 |
| 6,005,810 A | * | 12/1999 | Wu | 365/185.33 |
| 6,580,643 B1 | * | 6/2003 | Satoh et al. | 365/185.22 |
| 6,930,928 B1 | * | 8/2005 | Liu et al. | 365/185.29 |

* cited by examiner

*Primary Examiner*—David Lam (57) ABSTRACT

The present invention provides a method for erasing floating gate memory devices. Specifically, one embodiment of the present invention discloses a method for erasing an array of non-volatile flash memory cells arranged in a plurality of rows and a plurality of columns. A plurality of word lines are coupled to the plurality of rows. The embodiment of the method begins by applying a positive voltage to odd word lines in the plurality of word lines in a first phase of an erase cycle. The plurality of word lines comprising alternating odd and even word lines. The embodiment continues by applying a negative voltage to even word lines in the plurality of word lines in the first phase of the erase cycle. Then, the embodiment applies the negative voltage to the odd word lines in the plurality of word lines in a second phase of said erase cycle. Thereafter, the embodiment continues by applying the positive voltage to the even word lines in the second phase of the erase cycle.

26 Claims, 9 Drawing Sheets

METHOD FOR PULSE ERASE IN DUAL BIT MEMORY DEVICES

TECHNICAL FIELD

The present invention relates to the field of microelectronic integrated circuits. Specifically, the present invention relates to dual bit flash memory devices.

BACKGROUND ART

A flash or block erase memory (flash memory), such as, Electrically Erasable Programmable Read-Only Memory (Flash EEPROM), includes an array of cells which can be independently programmed and read. The size of each cell and thereby the memory as a whole are made smaller by eliminating the independent nature of each of the cells. As such, all of the cells are erased together as a block.

A memory of this type includes individual Metal-Oxide Semiconductor (MOS) memory cells that are field effect transistors (FETs). Each FET, or flash, memory cell includes a source, drain, and control gate to which various voltages are applied to program the cell with a binary 1 or 0, or erase all of the cells as a block. The flash memory cell provides for nonvolatile data storage.

A typical configuration of an array of flash memory cells includes rows and columns of flash memory cells. The array is supported by word lines and bit lines, wherein the word lines are coupled to gates of flash memory cells, and the bit lines are coupled to drains.

In a dual bit flash memory cell, the flash memory cell stores data by holding charge within an oxide-nitride-oxide (ONO) layer. The charge storage element within the ONO layer allows electrons to be stored on either side of the flash memory cell. As a result, the basic memory cell behaves as two independent conventional memory cells. In a typical dual bit flash memory cell, a program operation is done by injecting hot electrons into the ONO layer, and an erase operation is done by injecting hot holes into the ONO layer.

In a floating gate flash memory cell, the flash memory cell stores data by holding charge within the floating gate. In a write operation, charge can be placed on the floating gate through hot electron injection, or Fowler-Nordheim (F-N) tunneling. In addition, F-N tunneling can be typically used for erasing the flash memory cell through the removal of charge on the floating gate.

Figure 1A:
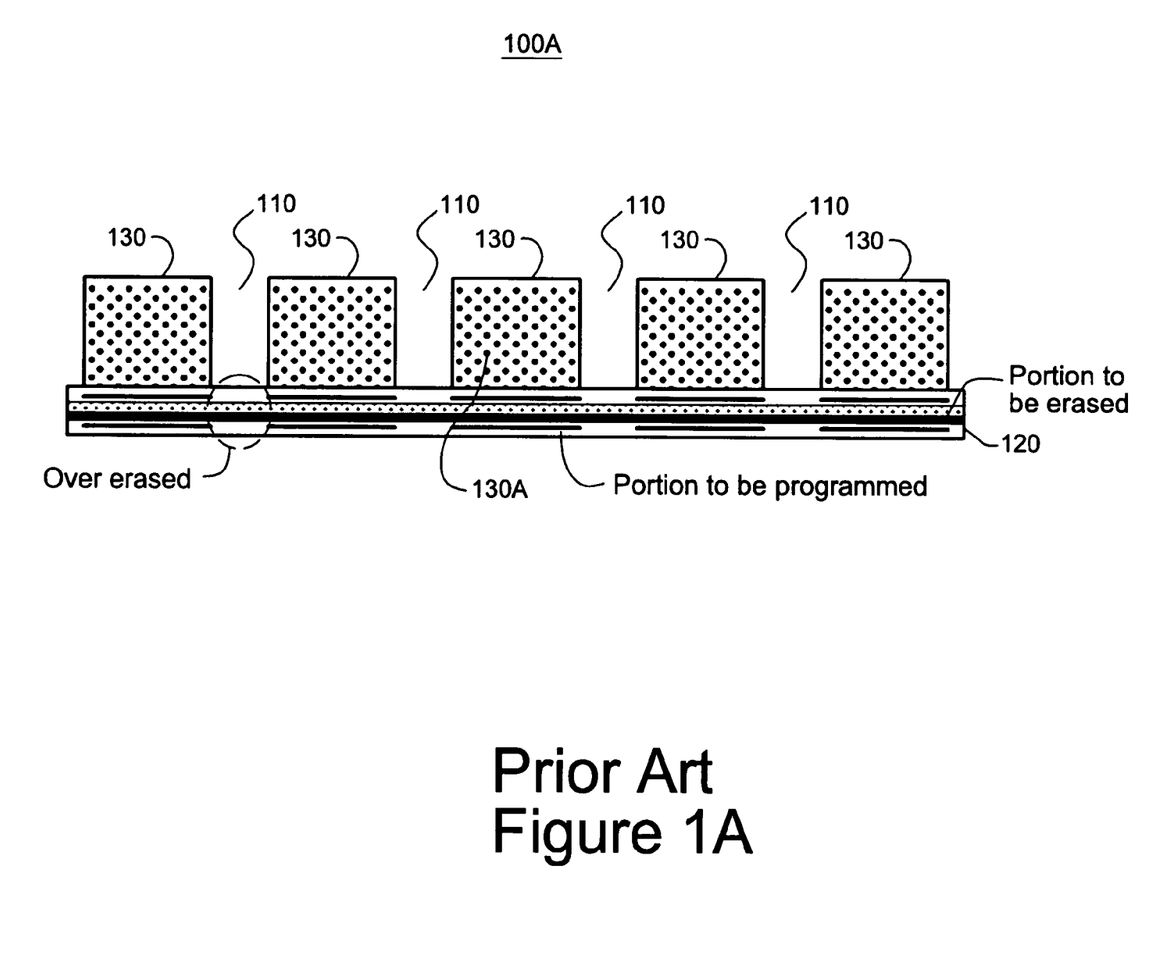
FIG. 1A is a diagram illustrating the over-erasure of non-volatile dual bit flash memory cells in an array of non-volatile memory cells.

A common failure in flash memory is a programming failure due to an over-erasure of the flash memory. Prior Art FIG. 1A illustrates the over-erasure in a flash memory array 100A consisting of dual bit floating gate memory cells. For purposes of illustration only, in one case, the cross sectional view of the flash memory array 100A as presented in Prior Art FIG. 1A can be taken along line B–B' of FIG. 3 in a dual bit case.

During multiple erase and program cycles, overerasure under the sidewall region 110 between a plurality of word lines 130 occurs. That is, over-erasure occurs due to hot hole injection of electrons into the sidewall region 110. For example, in an erase cycle of the conventional art, a negative voltage (e.g., −6 volts) is applied to an entire block of the array, a positive voltage (e.g., +6 volts) is applied to the drains of memory cells in the array, and the corresponding sources are left floating. As shown in Prior Art FIG. 1, the ONO layer 120 is erased during the erase process, as indicated by the darkened layer. This is because the potential of the sidewall region 110 reaches the applied potential on the plurality of word lines 130. As such, even the ONO layer 120 between each of the plurality of word lines 130 beneath the sidewall region 110 is erased.

During a program cycle, an isolated flash memory cell 130A in the array 100 is subjected to voltage to program the floating gate layer under the gate. Typically, a high positive voltage (e.g., +9.5 volts) is applied to the gate through an associated word line, the source is grounded, and a positive voltage (e.g., +5 volts) is applied to the drain through an associated bit line. Because the applied voltage is isolated to each of the gate, source, and drain regions of the programmed flash memory cell 130A, the programmed region, as shown in Prior Art FIG. 1 is isolated to the ONO layer under the gate.

After multiple erase and program cycles, because the programmed portion and erased portion do not overlap between the word lines 130, certain areas under the sidewall region 110 between the plurality of word lines 130 are subjected to multiple erase cycles without any correction from a program cycle. As a result this develops an accumulation of holes between the word lines 130 and under those sidewall regions subjected to multiple erase cycles. This reduces the threshold voltage of the associated flash memory cell and results in overerasure of those flash memory cells.

Figure 1B:
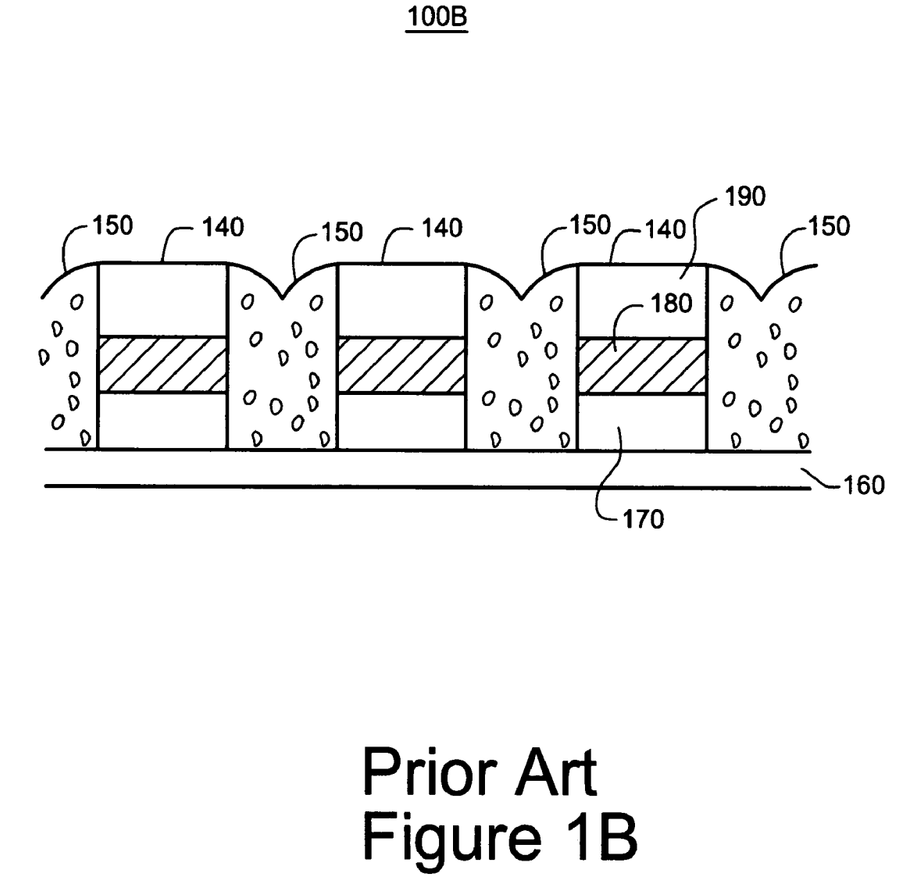
FIG. 1B is a diagram illustrating the over-erasure of non-volatile floating gate flash memory cells in an array of non-volatile memory cells.

Correspondingly, prior Art FIG. 1B illustrates the overerasure in a floating gate flash memory array 100B that consists of floating gate flash memory cells 140, to include flash memory cell 140A. For purposes of illustration only, in one case, the cross sectional view of the flash memory array 100B as presented in Prior Art FIG. 1B can be taken along line B–B' of FIG. 3 in a floating gate case. Construction of each of the floating gate flash memory cells 140 in the floating gate flash memory array 100B includes, in part, a control gate 190, an ONO layer 180, a floating gate 170, and a tunnel oxide layer 160.

During multiple erase and program cycles, overerasure under the sidewall region 150 between a plurality of word lines that are coupled to the control gates 190 of each of the floating gate flash memory cells 140 occurs. That is, overerasure occurs due to hole injection into the sidewall region 150.

Unfortunately, having an over-erased cell (floating gate or dual bit flash memory) on the same column line with a programmed cell can cause a failure when the programmed cell is read. The over-erased cell produces a leakage current and causes the entire column to malfunction. In particular, the current that is read from the column should be below a reference current ($I_{Ref}$) that corresponds to a properly configured threshold voltage, when reading a programmed cell. $I_{Ref}$ is the erased cell reference current used for comparison.

However, if an over-erased cell is in the same column as that of the programmed cell, the over-erased cell has a threshold voltage that is less than 0 producing a leakage current ($I_{Leak}$). As such, the total current read from the column will include the current from the programmed memory cell ($I_{Program}$) and the leakage current. If the sum of $I_{Program}+I_{Leakage}>I_{Ref}$, then the total current being read from the column is greater than the reference current, and the programmed cell appears to be erased.

What is needed is a method for erasing flash memory cells that does not induce overerasure in an array of flash memory cells.

DISCLOSURE OF THE INVENTION

The present invention provides a method for erasing floating gate memory devices. Specifically, one embodiment of the present invention discloses a method for erasing an array of non-volatile flash memory cells arranged in a plurality of rows and a plurality of columns. A plurality of word lines is coupled to the plurality of rows. The embodiment of the method begins by applying a positive voltage to odd word lines in the plurality of word lines in a first phase of an erase cycle. The plurality of word lines comprising alternating odd and even word lines. The embodiment continues by applying a negative voltage to even word lines in the plurality of word lines in the first phase of the erase cycle. Then, the embodiment applies the negative voltage to the odd word lines in the plurality of word lines in a second phase of said erase cycle. Thereafter, the embodiment continues by applying the positive voltage to the even word lines in the second phase of the erase cycle.

BRIEF DESCRIPTION OF THE DRAWINGS

PRIOR ART

PRIOR ART

BEST MODES FOR CARRYING OUT THE INVENTION

Reference will now be made in detail to the preferred embodiments of the present invention, a method for erasing an array of non-volatile memory cells to reduce over-erasure of memory cells. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Accordingly, the present invention discloses a method for erasing memory cells by applying alternating positive and negative voltages to word lines in an array of memory cells to reduce over-erasure of memory cells in the array. As a result, embodiments of the present invention are more reliable than conventional erase processes of arrays of memory cells by reducing leakage current due to over-erased memory cells. Specifically, embodiments of the present invention significantly reduce the effects of overerasure and subthreshold degradation in non-volatile memory cells.

Figure 2A:
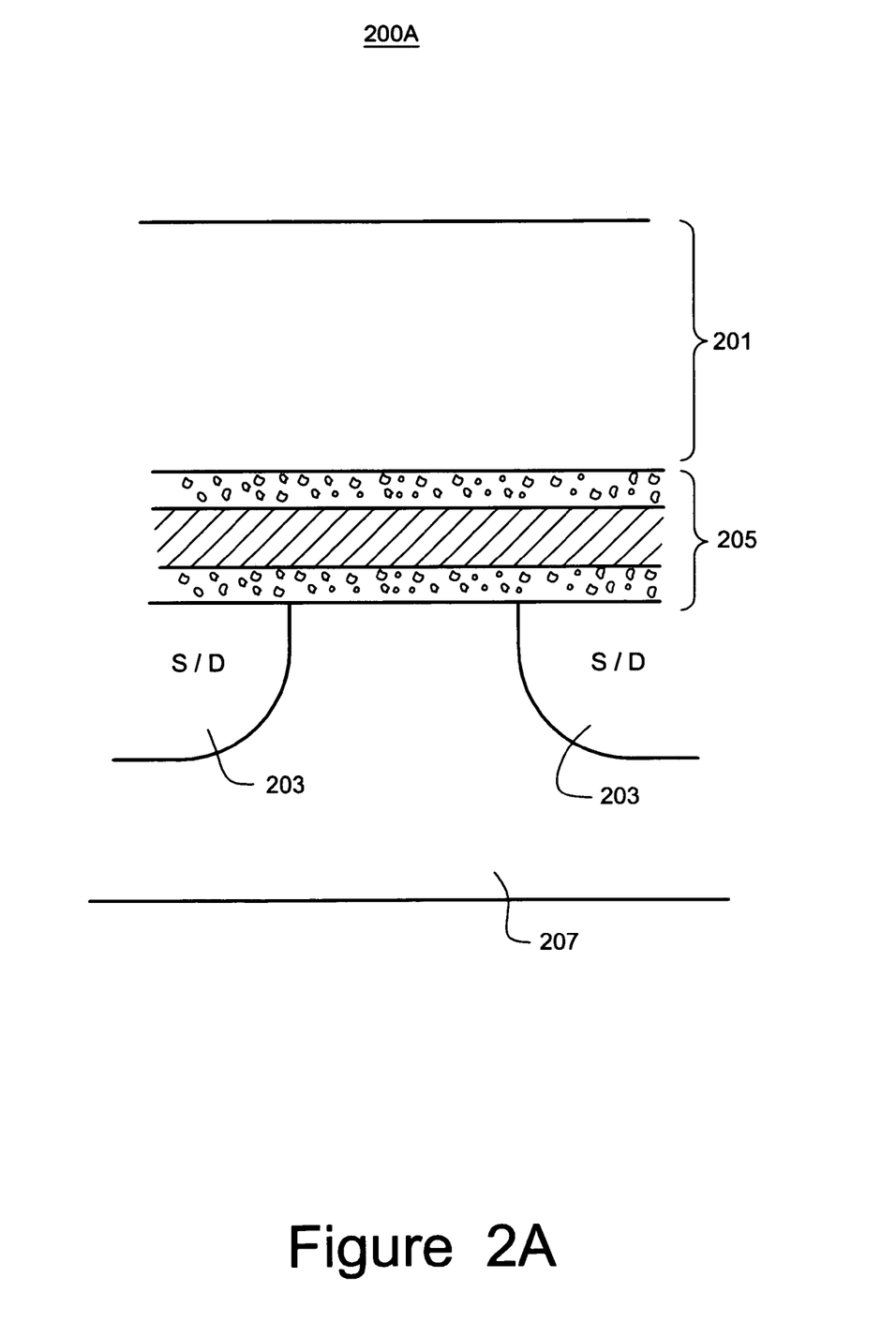
FIG. 2A is a diagram of a non-volatile dual bit flash memory cell, in accordance with one embodiment of the present invention.

Referring now to FIG. 2A, a typical configuration of a dual bit memory cell 200A, that is a flash memory cell, for implementation within an array of memory cells is shown, in accordance with one embodiment of the present invention. The cross sectional view of the flash memory array 200A as presented in FIG. 2A is taken along line A–A' of FIG. 3 in a dual bit case. The dual bit memory cell 200A consists of an oxide-nitride-oxide (ONO) layer 205, within which the storage element is contained. That is, charge is stored within the ONO layer 205 on either side of the dual bit memory cell 200A. The ONO layer 205 is sandwiched between a control gate 201 and a crystalline silicon semiconductor substrate 207. The substrate 207 includes selectable source/drain regions 203.

In the dual bit memory cell 200A, the basic transistor is very different from conventional memory cells. Instead of the classical asymmetric transistor with a distinctly doped source and drain, the dual bit memory cell 200A uses a symmetric transistor with similarly doped source and drain regions 203.

As a result, the dual bit memory cell comprises two distinct storage areas for programming and erasing. That is, the dual bit memory cell 200A can store one bit on the left side of the cell 200A and separately store another bit on the right side of the dual bit memory cell 200A. Once electrons are placed into one side of the storage element, for example on the left side of the cell, they remain trapped on that side. Similarly, once electrons are placed into the right side of the cell, they remain trapped to the right side. Consequently, read, program and erase operations are performed at full speed and power regardless of whether the left bit or right bit is used. As a result the basic dual bit memory cell 200A behaves as though it were two independent conventional memory cells. This architecture therefore offers twice the density of standard memory cells without sacrificing performance or reliability.

Figure 2B:
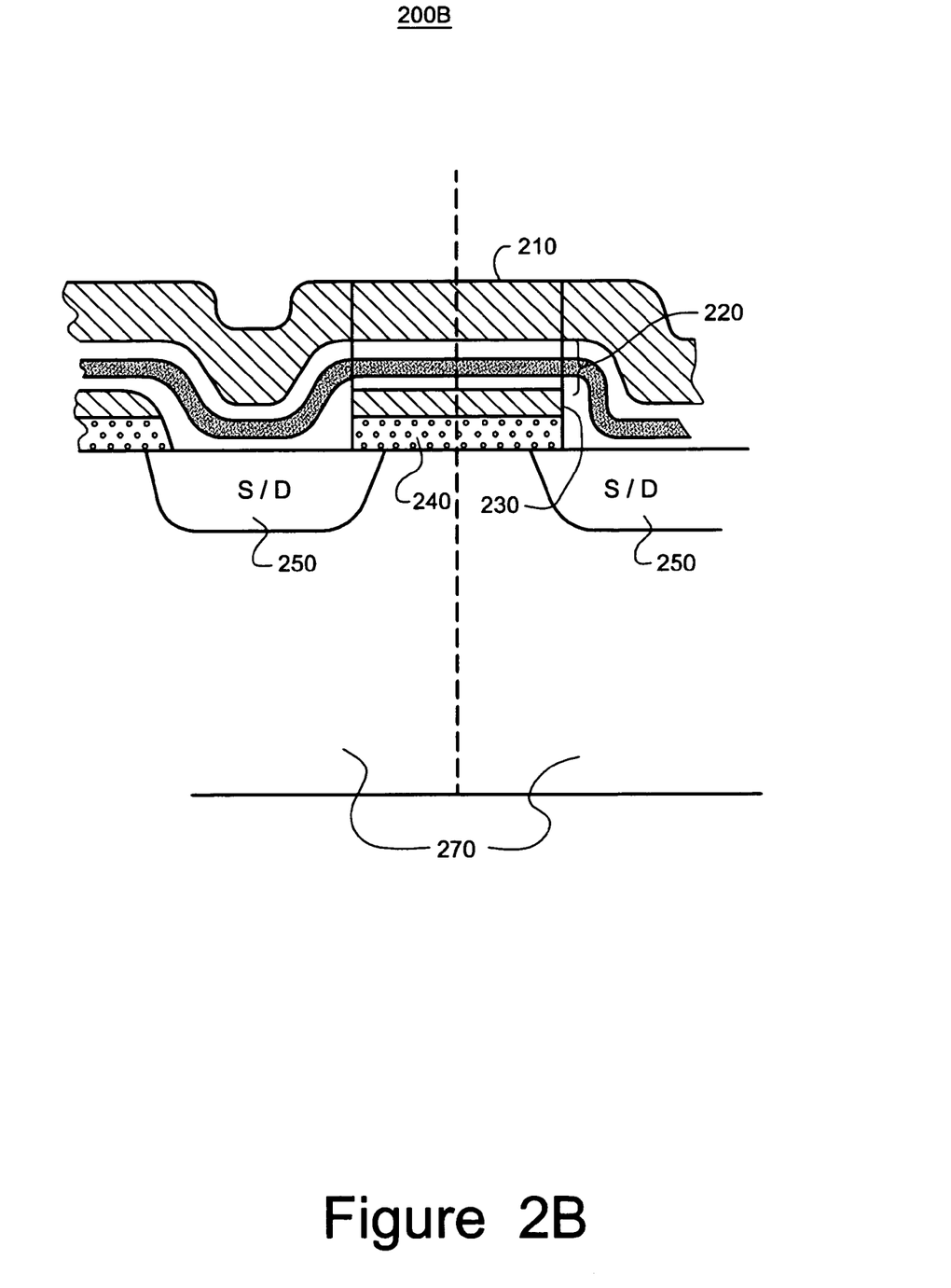
FIG. 2B is a diagram of a non-volatile floating gate flash memory cell, in accordance with one embodiment of the present invention.

While embodiments of the present invention are discussed within the context of the dual bit memory cell as described in FIG. 2A, other embodiments of the present invention are well suited to arrays of memory cells suitable for and supporting a wide range of flash memory cells, including floating gate flash memory, such as the one depicted in FIG. 2B.

Referring now to FIG. 2B, a typical configuration of a floating gate memory cell 200B, that is a flash memory cell, for implementation within an array of memory cells is shown, in accordance with one embodiment of the present invention. The cross sectional view of the flash memory array 200B as presented in FIG. 2B is taken along line A–A' of FIG. 3 in a floating gate case. The floating gate memory cell 200B consists of a thin, high-quality tunnel oxide layer 240 sandwiched between a conducting polysilicon floating gate 230 and a crystalline silicon semiconductor substrate 270. The tunnel oxide layer 240 is typically composed of silicon oxide ($Si_xO_y$). The substrate 270 includes selectable source/drain regions 250 that can be separated by an underlying channel region. A control gate 210 is provided adjacent to the floating gate 230, and is separated by an interpoly dielectric 220. Typically, the interpoly dielectric 220 can be composed of an oxide-nitride-oxide (ONO) structure.

The floating gate memory cell 200B stores data by holding charge within the floating gate 230. In a write operation, charge can be placed on the floating gate 230 through hot electron injection, or Fowler-Nordheim (F-N) tunneling. In addition, F-N tunneling can be typically used for erasing the flash memory cell through the removal of charge on the floating gate.

Figure 3:
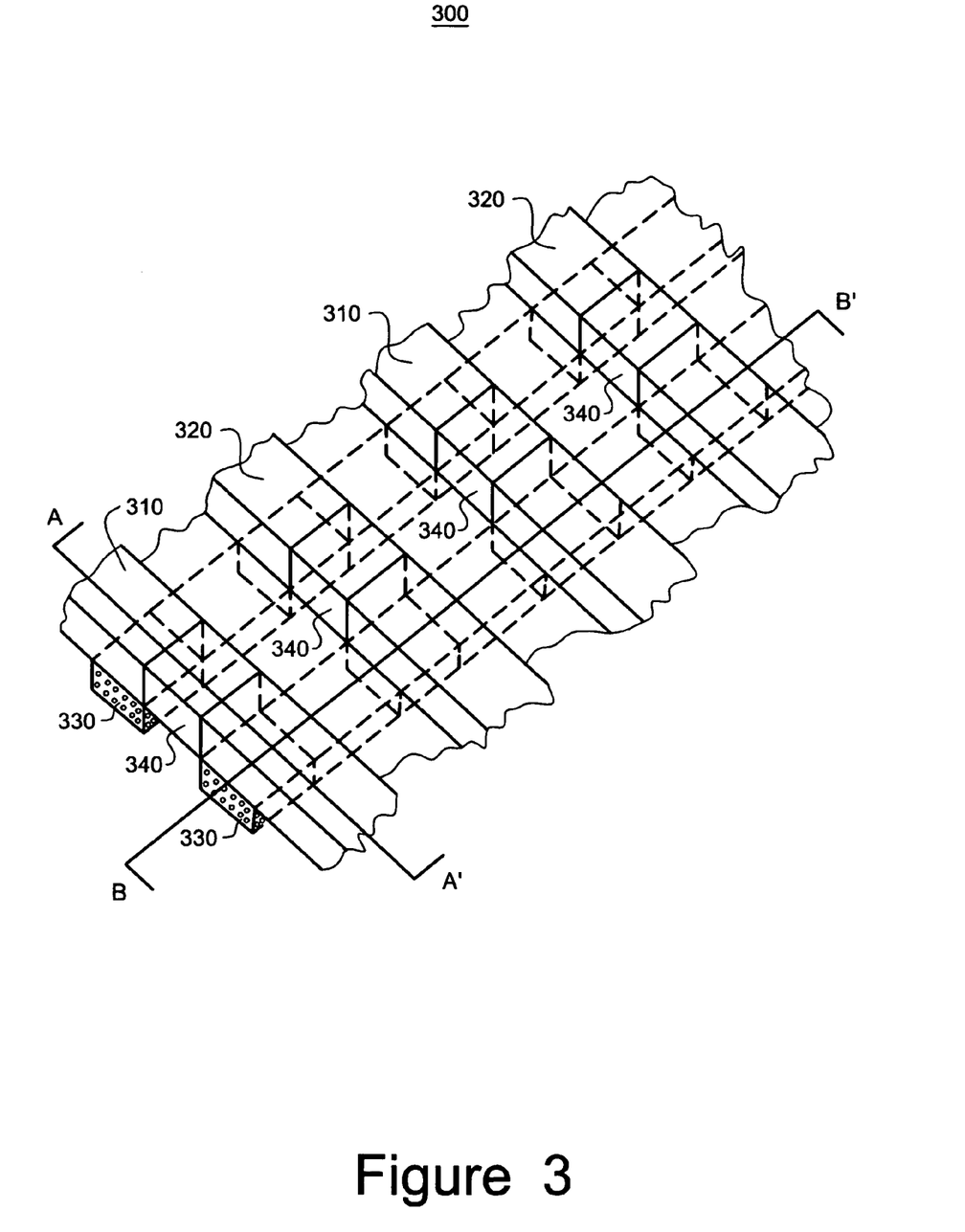
FIG. 3 is a diagram of an array of non-volatile memory cells that is capable of performing a method for erasing memory cells by applying alternating positive and negative voltages to word lines in an array of memory cells to reduce over-erasure of memory cells, in accordance with one embodiment of the present invention.

FIG. 3 is a surface diagram of an array 300 of non-volatile memory cells, in accordance with one embodiment of the present invention. The array is suitable for performing a method for erasing memory cells by applying alternating positive and negative voltages to word lines in the array 300. The method reduces over-erasure of memory cells in the array 300.

The array 300 is comprised of non-volatile memory cells. In one embodiment, the non-volatile memory cells comprise dual bit flash memory cells, as shown in FIG. 2. In other embodiments, the non-volatile memory, with modification, comprises floating gate flash memory cells.

The array 300 comprises a plurality of word lines that form the control gates to the non-volatile memory cells. The word lines are arranged on the surface of the array 300 in a substantially parallel formation. The word lines are identical in formation. For purposes of the present invention, the word lines are referenced in an odd and even convention. That is, alternating word lines comprise an odd word line and an even word line. For example, the array 300 comprises odd word lines 310 and even word lines 320. As shown in FIG. 3, the odd word lines 310 alternate with the even word lines 320 across the surface of the array 300.

Bit lines 330 form the source/drain regions for respective dual bit memory cells. Stack regions 340 define individual dual bit flash memory cells serviced by adjacent source/drain regions located on either side of the stack regions 340 in the substrate, and are comprised of an ONO layer and control gate layer. The word lines 310 and 320 are electrically coupled to the control gate layers.

FIGS. 4, and 5A–C in combination disclose a method for erasing an array of memory cells and depictions of memory cells that are undergoing the erase cycle in the method. The erase is isolated to regions under the word lines of the array to reduce overerasure and subthreshold degradation of memory cells in the array.

Figure 4:
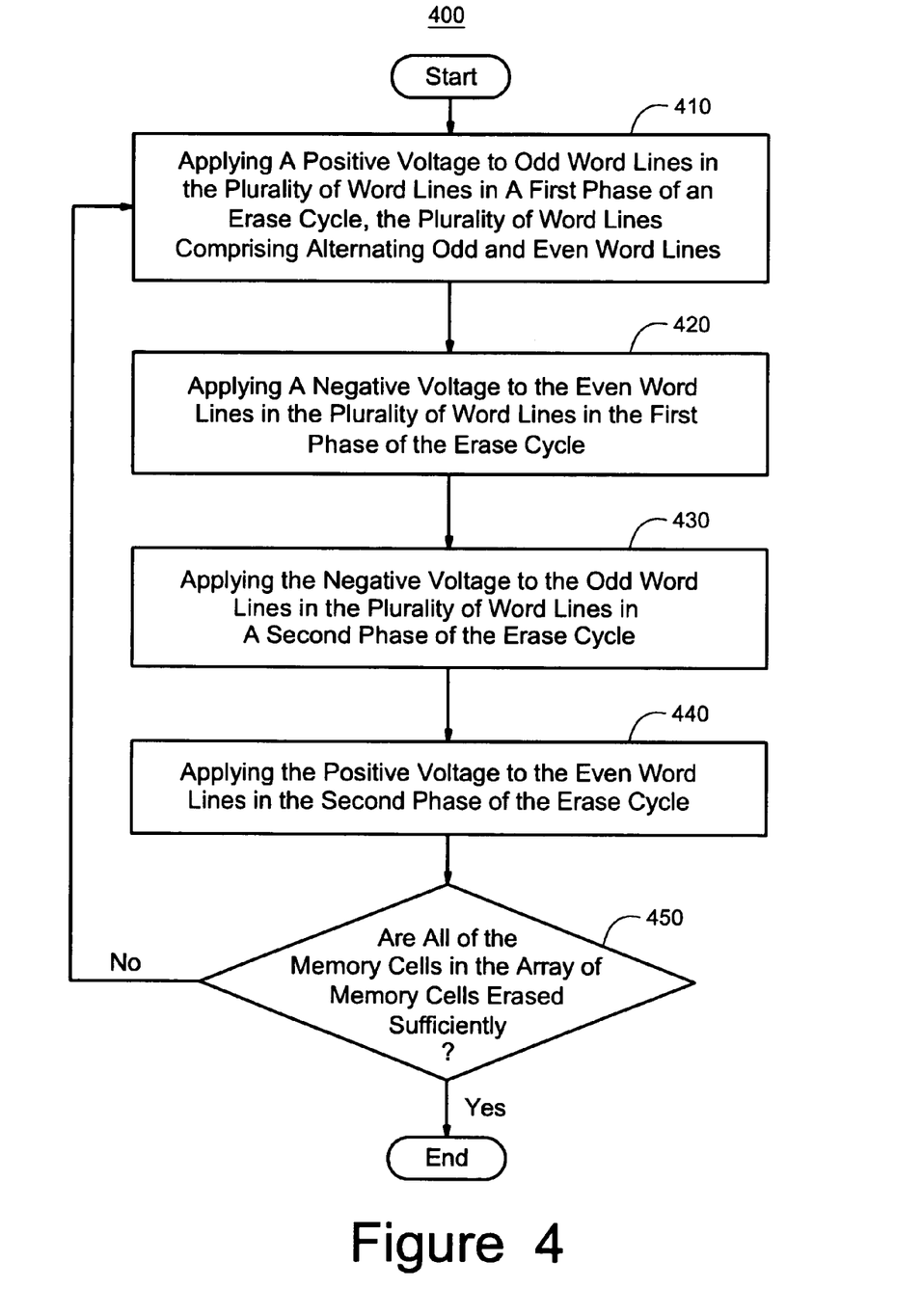
FIG. 4 is a flow chart illustrating steps in a method for erasing memory cells by applying alternating positive and negative voltages to word lines in an array of memory cells to reduce over-erasure of memory cells, in accordance with one embodiment of the present invention.

Now referring to FIG. 4, a flow chart 400 illustrating steps in a computer implemented method for erasing an array of non-volatile memory cells to reduce over-erasure of memory cells is disclosed, in accordance with one embodiment of the present invention. The method is applied to a non-volatile memory. The non-volatile memory comprises at least one array of memory cells that is arranged in a plurality of rows and a plurality of columns. A plurality of word lines is coupled to the plurality of rows, and a plurality of bit lines is coupled to the plurality of column. Moreover, each of the memory cells comprises a source, a control gate coupled to a word line, and bit lines coupled to a drain and/or source. Each of the memory cells is capable of storing at least one bit.

The present embodiment begins by applying a positive voltage to odd word lines in the plurality of word lines, at 410. The positive voltage is applied to odd word lines in a first phase of an erase cycle. Moreover, in the array of memory cells, the plurality of word lines comprises and is arranged in alternating odd and even word lines.

At 420, the present embodiment continues by applying a negative voltage to even word lines in the plurality of word lines. The application of the negative voltage to even word lines occurs during the first phase of the erase cycle.

In one embodiment, during the erase cycle of the first and second phases, the positive voltage is approximately positive 6 volts, and the negative voltage is approximately negative 6 volts.

In one embodiment, the processes at 410 and 420 are performed simultaneously during the first phase of the erase cycle. In another embodiment, the processes at 410 occur before the processes at 420.

Figure 5A:
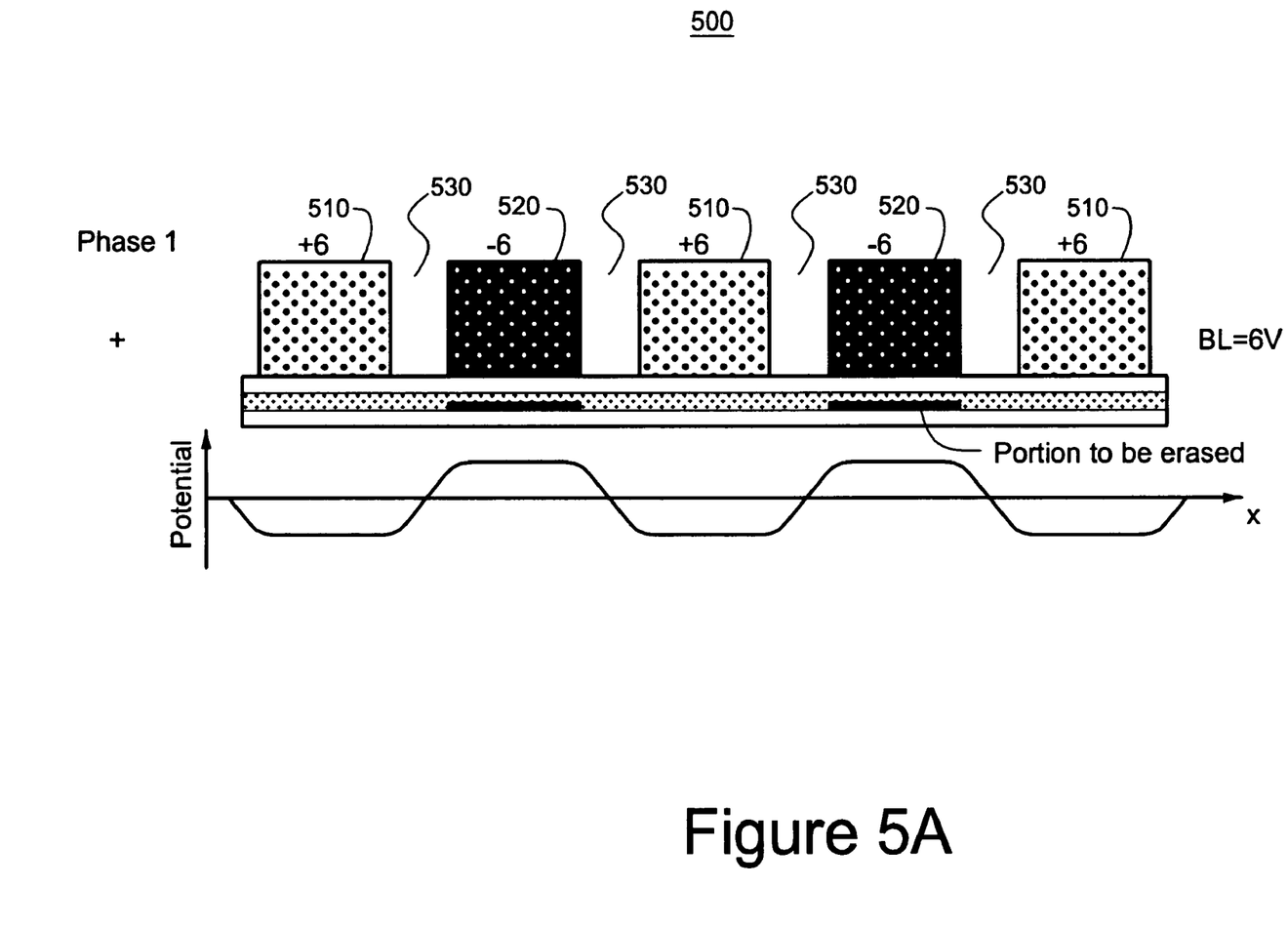
FIG. 5A is a diagram of a cross section of an array of non-volatile memory cells illustrating the first phase of an erase cycle in a method for erasing the non-volatile memory cells, in accordance with one embodiment of the present invention.

Now referring to FIG. 5A, a diagram of a cross-section of an array 500 is disclosed. The array 500 is comprised of dual bit flash memory cells, in the present embodiment; however, other embodiments, with modification are suitable to supporting erasure of floating gate flash memory cells. The cross-section depicts phase one of an erase cycle. In FIG. 5A, the processes at 410 and 420 occur simultaneously during the first phase of the erase cycle.

In FIG. 5A, the array 500 comprises odd word lines 510. In addition, the array 500 comprises even word lines 520. As shown in FIG. 5A, during the first phase, a positive voltage (e.g., +6 volts) is applied to the odd word lines 510. Also, a negative voltage (e.g., −6 volts) is applied to the even word lines 520. As such, the memory cells associated with the even wordlines 520 are erased, as shown by the dark areas of the under the even word lines 520.

The erase of the array of the memory cells is isolated to ONO layer directly under the even word lines 520 in the first phase of the erase cycle. As shown in FIG. 5A, the potential in the sidewall regions between the alternating odd and even word lines, 510 and 520 respectively, varies between positive 6 volts and negative 6 volts. That is, in the sidewall regions 530, a potential of +6 volts appears near the odd word lines and slides down to −6 volts near the even word lines 520. As such, the erase of the ONO layer under the sidewall regions 530 is isolated to those regions under the even word lines where a negative voltage (e.g., −6 volts) is applied.

Referring back to FIG. 4, at 430, the present embodiment continues by applying the negative voltage to the odd word lines in the plurality of word lines. The negative voltage is applied to odd word lines in a second phase of the erase cycle.

At 440, the present embodiment continues by applying the positive voltage to the even word lines. The positive voltage is applied to even word lines in the second phase of the erase cycle.

In one embodiment, the first phase and the second phase of the erase cycle comprise substantially similar erase pulse times. That is, the application of voltages during the first phase and second phase occur over a similar length of time.

Figure 5B:
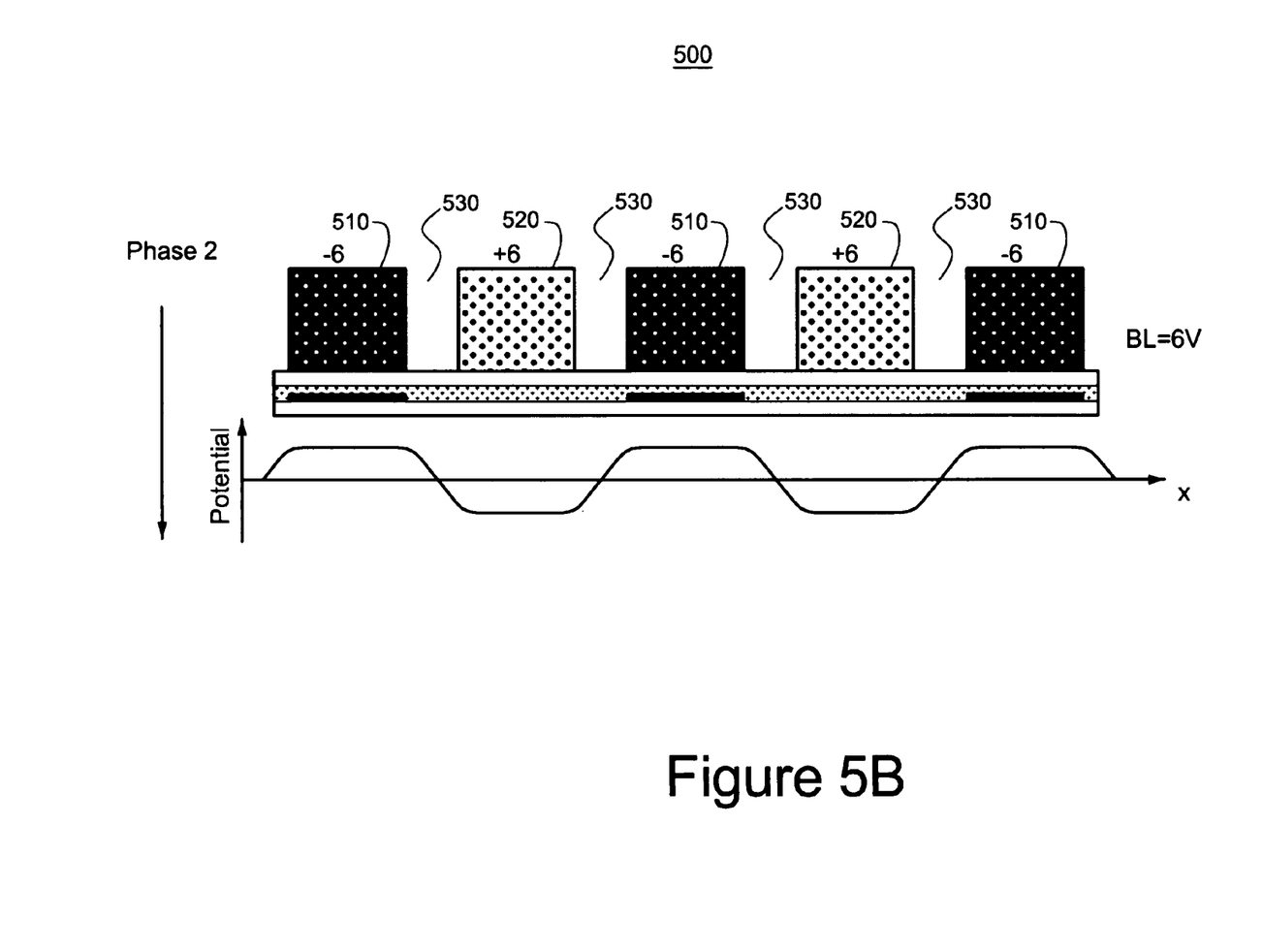
FIG. 5B is a diagram of a cross section of an array of non-volatile memory cells illustrating the second phase of an erase cycle in a method for erasing the non-volatile memory cells, in accordance with one embodiment of the present invention.

Now referring to FIG. 5B, a diagram of a cross-section of an array 500 is disclosed. The cross-section depicts phase two of an erase cycle. In FIG. 5B, the processes at 430 and 440 occur simultaneously during the second phase of the erase cycle.

In FIG. 5B, during the second phase, a negative voltage (e.g., −6 volts) is applied to the odd word lines 510. Also, a positive voltage (e.g., +6 volts) is applied to the even word lines 520. As such, the memory cells associated with the odd wordlines 510 are erased, as shown by the dark areas under the odd word lines 510.

In the second phase of the erase cycle, the erase of the array of the memory cells is isolated to ONO layers directly under the odd word lines 510. As shown in FIG. 5B, the potential in the sidewall regions 530 between the alternating odd and even word lines, 510 and 520 respectively, now varies between negative 6 volts and positive 6 volts. That is, in the sidewall regions 530, a potential of −6 volts appears near the odd word lines and slides up to +6 volts near the even word lines 520. As such, the erase of the ONO layer under the sidewall regions 530 is isolated to those ONO layers under the odd word lines 510 where a negative voltage (e.g., −6 volts) is applied.

Importantly, the potential applied to the odd word lines alternate between a positive voltage and a negative voltage in the first and second phases of the erase cycle. Also, the potential applied to the even word lines alternate between a negative voltage and a positive voltage in the first and second phases of the erase cycle. As such, the sidewall regions 530 of FIGS. 5A–C are subjected to alternating voltage potentials in the two phases of the erase cycle thereby eliminating erasure of ONO layer under the sidewall regions.

Referring back to FIG. 4, at decision step 450, the present embodiment continues by determining if all the memory cells in the array of memory cells have been sufficiently erased. That is, the present embodiment verifies if the memory cells in the array of memory cells are erased sufficiently. If the memory cells have been sufficiently erased, then the present embodiment ends. On the other hand, if the memory cells have not been sufficiently erases, then the present embodiment returns back to the first phase of the erase cycle at 410 to execute the erase cycle again. The erase cycle is executed until all the memory cells in the array of non-volatile memory cells have sufficiently been erased. That is, the process in flow chart 400 is repeated until the memory cells in the array of memory cells are erased sufficiently.

In all phases of the method of FIG. 4, a positive voltage is applied to the plurality of drains of the array of memory cells, in embodiments of the present invention. In one embodiment, the positive voltage is +6.0 volts. In another embodiment, a positive voltage is applied to the plurality of drains and to the plurality of sources. In one embodiment, the positive voltage is again +6.0 volts.

Figure 5C:
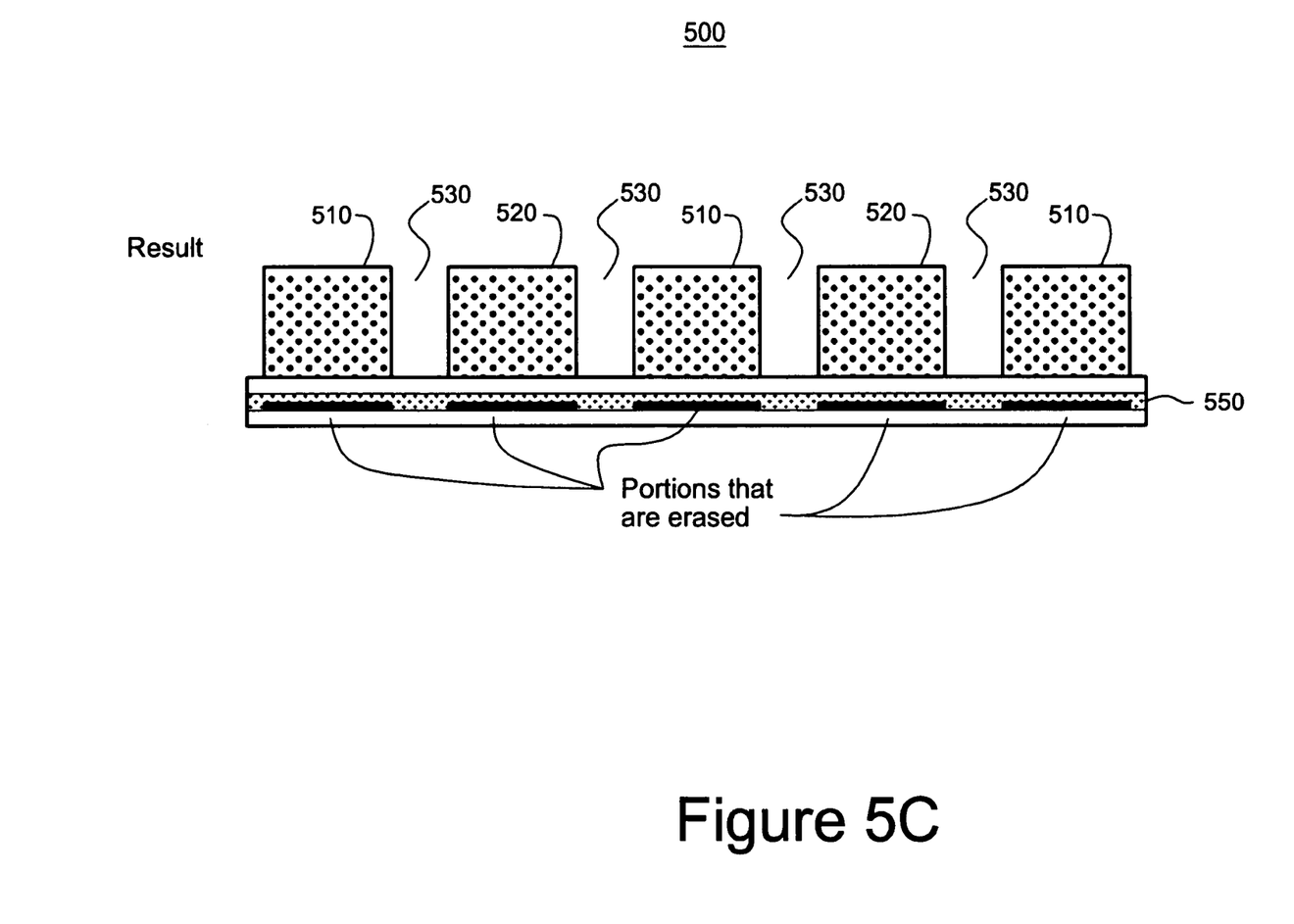
FIG. 5C is a diagram of a cross section of an array of non-volatile memory cells illustrating the results of an erase cycle in a method for erasing the non-volatile memory cells, in accordance with one embodiment of the present invention.

FIG. 5C is a diagram of a cross-section of the array 500 after completion of one or more erase cycles. As shown in FIG. 5C, the erase of the flash memory cells is isolated to those ONO layers under the odd and even word lines. As a result, the overlap of programmed portions and erased portions of the ONO layer 550 is achieved. Consequently, a high threshold voltage is maintained between the word lines (510 and 520) of the array 500, resulting in a reduction in subthreshold degradation. In addition, overerase of the memory cells is reduced.

In another embodiment, a method is disclosed for erasing a non-volatile memory cells in a memory device. The memory device comprises at least one non-volatile memory cell comprising a source, a control gate, and a drain. The memory cell is capable of storing at least one bit. The memory device also comprises an adjoining non-volatile memory cell.

The present embodiment begins by applying a positive voltage to a control gate in a first phase of an erase cycle. Then, in the first phase, the present embodiment continues by applying a negative voltage to an adjoining control gate associated with the adjoining non-volatile memory cell.

Thereafter, during a second phase of the erase cycle, the present embodiment continues by applying the negative voltage to the control gate in a second phase of the erase cycle. Then, a positive voltage is applied to the adjoining control gate in said second phase of said erase cycle.

As a result, the non-volatile memory cell and the adjoining memory cell are erased without any overerasure, and subthreshold degradation. As such, a high voltage threshold is maintained in the memory cells.

The preferred embodiment of the present invention, a method for erasing an array of non-volatile memory cells to reduce over-erasure of memory cells, is thus described. While the present invention has been described in particular embodiments, it should be appreciated that the present invention should not be construed as limited by such embodiments, but rather construed according to the below claims.

What is claimed is:

1. In a non-volatile memory comprising at least one array of memory cells arranged in a plurality of rows and a plurality of columns, a plurality of word lines coupled to said plurality of rows, a plurality of bit lines coupled to said plurality of columns, the memory cells comprising a source, a control gate coupled to a word line, and a drain coupled to a bit line, and capable of storing at least one bit, a method for erasing said array of memory cells, comprising:
   applying a positive voltage to odd word lines in said plurality of word lines in a first phase of an erase cycle, said plurality of word lines comprising alternating odd and even word lines;
   applying a negative voltage to said even word lines in said plurality of word lines in said first phase of said erase cycle;
   applying said negative voltage to said odd word lines in said plurality of word lines in a second phase of said erase cycle; and
   applying said positive voltage to said even word lines in said second phase of said erase cycle.

2. The method of claim 1, further comprising:
   applying another positive voltage to a plurality of drains of said array of memory cells.

3. The method of claim 2, wherein said another positive voltage is approximately positive 6 volts.

4. The method of claim 1, further comprising:
   floating sources of memory cells in said array of memory cells.

5. The method of claim 1, further comprising:
   applying another positive voltage to a plurality of drains and to a plurality of sources of said array of memory cells.

6. The method of claim 1, wherein said positive voltage is approximately positive 6 volts.

7. The method of claim 1, wherein said negative voltage is approximately negative 6 volts.

8. The method of claim 1, wherein said first cycle and said second cycle comprise substantially similar erase pulse times.

9. The method of claim 1, further comprising;
verifying memory cells in said array of memory cells are erased sufficiently; and
repeating said erase cycle until said memory cells in said array of memory cells are erased sufficiently.

10. The method of claim 1, wherein each of said memory cells in said array of memory cells comprises a dual bit flash memory device.

11. The method of claim 1, wherein each of said memory cells in said array of memory cells comprises a floating gate flash memory device.

12. In a memory device comprising at least one non-volatile memory cell comprising a source, a control gate, and a drain, and capable of storing at least one bit, and an adjoining non-volatile memory cell, a method for erasing said non-volatile memory cell, comprising:
applying a positive voltage to said control gate in a first phase of an erase cycle;
applying a negative voltage to an adjoining control gate associated with said adjoining non-volatile memory cell in said first phase of said erase cycle;
applying said negative voltage to said control gate in a second phase of said erase cycle; and
applying said positive voltage to said adjoining control gate in said second phase of said erase cycle.

13. The method of claim 12, further comprising:
applying another positive voltage to drains of said non-volatile memory cell and said adjoining non-volatile memory cell.

14. The method of claim 13, wherein said another positive voltage is approximately positive 6 volts.

15. The method of claim 12, further comprising:
floating sources of said non-volatile memory cell and said adjoining non-volatile memory cell.

16. The method of claim 12, further comprising:
applying another positive voltage to said drains and to said sources of said non-volatile memory cell and said adjoining non-volatile memory cell.

17. The method of claim 12, wherein said positive voltage is approximately positive 6 volts and said negative voltage is approximately negative 6 volts.

18. The method of claim 12, wherein said non-volatile memory cell and said adjoining non-volatile memory cell comprise a dual bit flash memory devices.

19. The method of claim 12, wherein said non-volatile memory cell and said adjoining non-volatile memory cell comprise a floating gate flash memory devices.

20. In a non-volatile memory comprising at least one array of memory cells arranged in a plurality of rows and a plurality of columns, a plurality of word lines coupled to said plurality of rows, a plurality of bit lines coupled to said plurality of columns, the memory cells comprising a source, a control gate coupled to a word line, and a drain coupled to a bit line, and capable of storing at least one bit, a method for erasing said array of memory cells comprising:
applying a positive voltage to a word line in a first phase of an erase cycle;
applying a negative voltage to said word line in a second phase of said erase cycle to confine erasure of a floating gate layer associated with memory cells supported by said word line to beneath said word line;
applying said negative voltage to an adjoining word line in said first phase of said erase cycle; and
applying said positive voltage to said adjoining word line in said second phase of said erase cycle.

21. The method of claim 20, further comprising:
applying another positive voltage to drains of memory cells supported by said word line in said erase cycle; and
floating sources of memory cells supported by said word line in said erase cycle.

22. The method of claim 20, further comprising:
applying another positive voltage to sources and drains of memory cells supported by said word line in said erase cycle.

23. The method of claim 20, wherein said positive voltage is approximately positive 6 volts.

24. The method of claim 20, wherein said negative voltage is approximately negative 6 volts.

25. The method of claim 20, wherein each of said memory cells in said array of memory cells comprises a dual bit flash memory device.

26. The method of claim 20, wherein each of said memory cells in said array of memory cells comprises a floating gate flash memory device.

* * * * *